(12) United States Patent
Ahmed

(10) Patent No.: US 9,076,641 B2
(45) Date of Patent: Jul. 7, 2015

(54) ULTRA-LOW RESISTIVITY CONTACTS

(71) Applicant: Intermolecular, Inc., San Jose, CA (US)

(72) Inventor: Khaled Ahmed, Anaheim, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/135,431

(22) Filed: Dec. 19, 2013

(65) Prior Publication Data

US 2014/0264825 A1    Sep. 18, 2014

Related U.S. Application Data

(60) Provisional application No. 61/779,740, filed on Mar. 13, 2013.

(51) Int. Cl.
*H01L 21/283* (2006.01)
*H01L 21/02* (2006.01)
*H01L 29/66* (2006.01)
*H01L 21/285* (2006.01)
*H01L 27/146* (2006.01)
*H01L 29/41* (2006.01)
*H01L 21/3065* (2006.01)
(Continued)

(52) U.S. Cl.
CPC .... *H01L 21/02005* (2013.01); *H01L 29/66477* (2013.01); *H01L 21/28575* (2013.01); *H01L 21/02172* (2013.01); *H01L 21/02175* (2013.01); *H01L 27/1462* (2013.01); *H01L 27/14643* (2013.01); *H01L 27/14698* (2013.01); *H01L 21/283* (2013.01); *H01L 29/41* (2013.01); *H01L 21/02104* (2013.01); *H01L 21/3065* (2013.01); *H01L 21/02178* (2013.01); *H01L 21/02181* (2013.01); *H01L 21/02189* (2013.01); *H01L 21/02205* (2013.01); *H01L 21/0228* (2013.01); *H01L 29/778* (2013.01); *H01L 29/1606* (2013.01); *H01L 29/66742* (2013.01); *H01L 29/786* (2013.01)

(58) Field of Classification Search
CPC ............... H01L 21/28575; H01L 21/02172; H01L 21/02175; H01L 21/283; H01L 21/02104; H01L 21/02205
USPC ................... 438/104, 585, 597, 795
See application file for complete search history.

(56) References Cited

U.S. PATENT DOCUMENTS 4,675,073 A * 6/1987 Douglas .............. 438/720
5,116,679 A * 5/1992 Nadkarni et al. ......... 428/367
(Continued)

OTHER PUBLICATIONS

Agrawal et al.; A Unified Model for Insulator Selection to Form Ultra-Low Resistivity MIS Contacts to n-Si, n-Ge and n-InGaAs; Jun. 15, 2012; Applied Materials, Inc.; pp. 1-5.

*Primary Examiner* — Michele Fan

(57) ABSTRACT

Contacts for semiconductor devices and methods of making thereof are disclosed. A method comprises forming a first layer on a semiconductor, the first layer comprising one or more metals; forming a second layer on the first layer, the second layer comprising the one or more metals, nitrogen and oxygen; and heating the first and second layer such that oxygen migrates from the second layer into the first layer and the first layer comprises a sub-stoichiometric metal oxide after heating. Exemplary embodiments use transition metals such as Ti in the first layer. After heating there is a sub-stoichiometric oxide layer of about 2.5 nm thickness between a metal nitride conductor and the semiconductor. The specific contact resistivity is less than about $7 \times 10^{-9}$ $\Omega \cdot cm^2$.

8 Claims, 5 Drawing Sheets

(51) Int. Cl.
*H01L 29/778* (2006.01)
*H01L 29/786* (2006.01)
*H01L 29/16* (2006.01)

(56) References Cited

U.S. PATENT DOCUMENTS

| | | | | |
|---|---|---|---|---|
| 5,568,352 | A * | 10/1996 | Hwang | 361/321.4 |
| 6,020,243 | A * | 2/2000 | Wallace et al. | 438/287 |
| 6,303,483 | B1 * | 10/2001 | Kunikiyo | 438/592 |
| 6,900,498 | B2 * | 5/2005 | Stauf et al. | 257/310 |
| 7,012,292 | B1 * | 3/2006 | Van Buskirk et al. | 257/295 |
| 8,394,669 | B2 * | 3/2013 | Arita et al. | 438/104 |
| 2003/0113972 | A1 * | 6/2003 | Hayashi et al. | 438/287 |
| 2004/0157473 | A1 * | 8/2004 | Hayashi et al. | 438/785 |
| 2004/0164415 | A1 * | 8/2004 | Teraguchi | 257/745 |
| 2004/0169240 | A1 * | 9/2004 | Koyama et al. | 257/411 |
| 2004/0266172 | A1 * | 12/2004 | Kim | 438/623 |
| 2005/0056219 | A1 * | 3/2005 | Dip et al. | 118/722 |
| 2005/0133910 | A1 * | 6/2005 | Riedl et al. | 257/729 |
| 2005/0186482 | A1 * | 8/2005 | Maschwitz | 430/1 |
| 2005/0282341 | A1 * | 12/2005 | Park et al. | 438/283 |
| 2006/0270191 | A1 * | 11/2006 | Tamura et al. | 438/458 |
| 2008/0278990 | A1 * | 11/2008 | Kumar et al. | 365/148 |
| 2010/0032839 | A1 * | 2/2010 | Koumoto et al. | 257/751 |
| 2010/0052007 | A1 * | 3/2010 | Osawa et al. | 257/103 |
| 2010/0117523 | A1 * | 5/2010 | Tchakarov | 313/504 |
| 2010/0200863 | A1 * | 8/2010 | Sasaki et al. | 257/76 |
| 2010/0227479 | A1 * | 9/2010 | Kim et al. | 438/778 |
| 2010/0258782 | A1 * | 10/2010 | Kuse et al. | 257/4 |
| 2010/0308298 | A1 * | 12/2010 | Ninomiya et al. | 257/5 |
| 2011/0037379 | A1 * | 2/2011 | Lecamp et al. | 313/503 |
| 2011/0044089 | A1 * | 2/2011 | Goux et al. | 365/148 |
| 2011/0317472 | A1 * | 12/2011 | Awaya et al. | 365/148 |
| 2012/0063201 | A1 * | 3/2012 | Hayakawa et al. | 365/148 |
| 2012/0193600 | A1 * | 8/2012 | Himeno et al. | 257/4 |
| 2012/0244698 | A1 * | 9/2012 | Ryan | 438/653 |
| 2012/0268980 | A1 * | 10/2012 | Awaya et al. | 365/148 |
| 2012/0292588 | A1 * | 11/2012 | Fujii et al. | 257/4 |
| 2013/0010529 | A1 * | 1/2013 | Hayakawa et al. | 365/148 |
| 2013/0015423 | A1 * | 1/2013 | Mikawa et al. | 257/4 |
| 2013/0034947 | A1 * | 2/2013 | Hong et al. | 438/384 |
| 2013/0056700 | A1 * | 3/2013 | Wang et al. | 257/4 |
| 2013/0071982 | A1 * | 3/2013 | Kumar et al. | 438/381 |
| 2013/0149794 | A1 * | 6/2013 | Wang | 438/3 |
| 2013/0193396 | A1 * | 8/2013 | Nakano et al. | 257/4 |
| 2013/0200324 | A1 * | 8/2013 | Pham et al. | 257/4 |
| 2013/0223133 | A1 * | 8/2013 | Azuma et al. | 365/148 |
| 2014/0021429 | A1 * | 1/2014 | Ito et al. | 257/2 |
| 2014/0061573 | A1 * | 3/2014 | Mikawa et al. | 257/4 |
| 2014/0312293 | A1 * | 10/2014 | Mikawa et al. | 257/4 |

* cited by examiner

ULTRA-LOW RESISTIVITY CONTACTS

CROSS-REFERENCE TO RELATED APPLICATIONS

This application claims priority from U.S. Provisional Patent Application Ser. No. 61/779,740, filed Mar. 13, 2013, which is incorporated by reference for all purposes.

FIELD OF THE INVENTION

One or more embodiments of the present invention relate to methods of manufacture of semiconductor devices.

BACKGROUND

As semiconductor devices continue to shrink in size, the contact resistance tends to increase and become more significant. Accordingly, there is a need to reduce the specific contact resistivity to keep the contact resistance within usable bounds. Specific resistivities below about $7 \times 10^{-9}$ $\Omega \cdot cm^2$ are desirable, but difficult to achieve using common metal-on-semiconductor or metal-nitride-on-semiconductor approaches.

For some semiconductors such as p-type Ge, Fermi-level pinning near the valence band provides sufficiently low contact resistivity. For n-type devices including those comprising Si, Ge, SiGe, or InGaAs semiconductors, other methods are required. For example, Agrawal et al. ("A unified model for insulator selection to form ultra-low resistivity metal-insulator-semiconductor contacts to n-Si, n-Ge, and n-InGaAs," *Appl. Phys. Let.*, 101, 042108 (2012)) disclose metal-insulator-semiconductor (MIS) contacts having a thin interfacial dielectric inserted between the metal and the semiconductor. The dielectric layer is thin enough that electrons can tunnel through the layer. These structures have the effect of unpinning the Fermi level and lowering the barrier height. Contact structures were formed and modeled using Al conductors and interfacial layers comprising various oxides and other chalcogenides including $TiO_2$, $Al_2O_3$, $La_2O_3$, ZnS, ZnSe, $SrTiO_3$, ZnO, $Ta_2O_5$, $GeO_2$, CdO, and $SnO_2$. Specific contact resistivities to n-Si as low as $10^{-9}$ $\Omega cm^2$ were obtained, which were described as five times lower than that of the "state-of-the-art" NiSi/n-Si structure at the same doping. These data are illustrated in FIG. 1.

SUMMARY OF THE INVENTION

Methods for fabricating a semiconductor device are disclosed comprising forming a first layer on a semiconductor, the first layer comprising one or more metals; forming a second layer on the first layer, the second layer comprising one or more metals, nitrogen and oxygen, and heating the first and second layer such that oxygen migrates from the second layer into the first layer and the first layer comprises a sub-stoichiometric metal oxide after heating. The heating step can be performed in an oxygen-free atmosphere, such as nitrogen or argon. The semiconductor can be Si, SiC, Ge, or SiGe, for example n-doped silicon. The semiconductor can also be a III-V semiconductor. The metal can be a transition metal. In some embodiments, the metal is Ti or Zn.

In some embodiments, the ratio of oxygen atoms to nitrogen atoms in the second layer is about 1:10 prior to the heating step. The first and second layers can be formed by physical vapor deposition, atomic layer deposition, chemical vapor deposition, or plasma enhanced variations thereof.

Methods for fabricating a contact test structure are disclosed where a plurality of site-isolated regions (SIRs) are designated on a substrate, each SIR comprising a semiconductor. In each SIR, a first layer is formed on the semiconductor, the first layer comprising one or more metals; a second layer is formed on the first layer, the second layer comprising the one or more metals, nitrogen and oxygen, and the first and second layers are heated in an oxygen-free atmosphere. Process parameters for heating and forming the first and second layers are varied among the plurality of SIRs in a combinatorial manner. The specific contact resistivity is measured for the contact test structure in each SIR. Process parameters to be varied can include one or more of sputtering target composition, sputtering power, sputtering pressure, sputtering atmosphere composition, sputtering time, precursor composition, precursor gas flow rates, substrate temperature, substrate bias, chamber pressure, processing time per cycle, number of deposition cycles, or precursor gas, and so forth.

In some embodiments, the layers are further characterized by measuring a structure or performance parameter of the first and second layers for each of the plurality of site-isolated regions. The structure or performance parameter can be one or more of crystallinity, grain size (distribution), lattice parameter, crystal orientation (distribution), matrix and minority composition, bandgap, carrier concentration, mobility, minority carrier lifetime, surface roughness, adhesion, thermal expansion coefficient, elemental composition, and thickness, and the like.

A low resistance contact to a semiconductor device is disclosed comprising a first layer disposed on a semiconductor, the first layer comprising a sub-stoichiometric oxide of a metal; and a second layer on the first layer, the second layer comprising the one or more metals, nitrogen and oxygen. The metal can be a transition metal. In some embodiments, the metal is Ti or Zn.

The thickness of the first layer (before heating) can between about 1 nm and about 2 nm, for example, about 2.5 nm. The thickness of the second layer (before heating) can be between about 2 nm and about 5 nm. The specific contact resistivity (after heating) can less than about $7 \times 10^{-9}$ $\Omega \cdot cm^2$, more particularly, about $1 \times 10^{-9}$ $\Omega \cdot cm^2$.

In some embodiments, the low resistance contact is to the source or drain of a field effect transistor.

DETAILED DESCRIPTION

Figure 1:
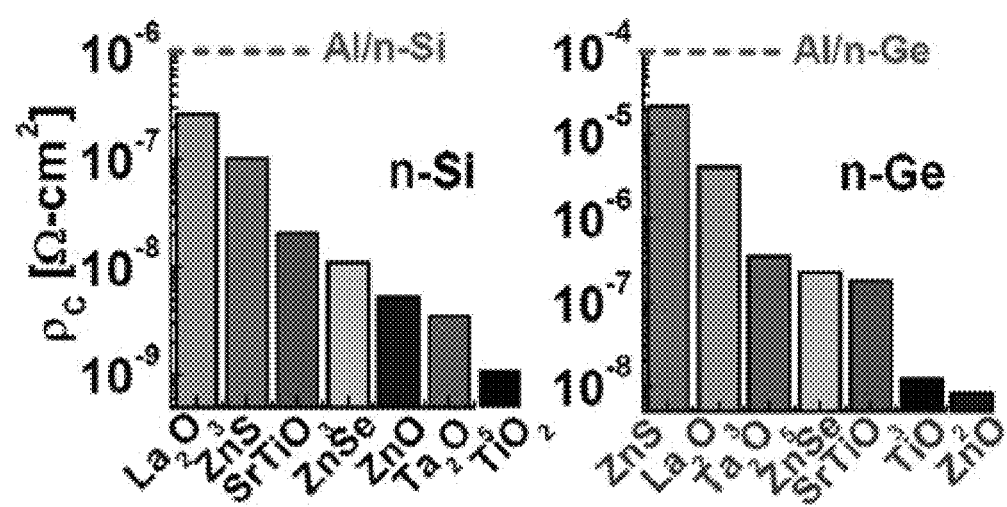
FIG. 1 shows the predicted specific contact resistivity of various MIS contacts on Si and Ge.

Before the present invention is described in detail, it is to be understood that unless otherwise indicated this invention is not limited to specific semiconductor devices or to specific semiconductor materials. Exemplary embodiments will be described for source and drain contacts for field-effect transistors, but other devices can also be fabricated using the methods disclosed. It is also to be understood that the terminology used herein is for the purpose of describing particular embodiments only and is not intended to limit the scope of the present invention.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limits of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

Definitions:

The term "MIS" or "metal-insulator-semiconductor" as used herein refers to a contact structure comprising a conductor (typically a metal or metal nitride) and a semiconductor (e.g., Si, Ge, SiGe, GaAs, InGaAs, etc.) with a thin interfacial dielectric layer (the "insulator") between the conductor and the semiconductor.

The term "sub-stoichiometric" as used herein refers to compounds where the atomic ratio deviates significantly (more than 0.1%) from the stoichiometrically correct ratio (wherein valence electrons are all balanced. For example, titanium forms a stoichiometric oxide with the formula $TiO_2$ having two O atoms for every Ti atom. A sub-stoichiometric oxide of titanium with the formula $TiO_x$ has $x<2$; typically $1 \leq x \leq 1.9$.

As used herein, the term "conductor" refers to a volume of material (such as a wire, thin layer, or electrode) comprising a "conductive material." The material is said to be "conductive" if there is negligible voltage drop across the conductor at operating currents. In certain instances, a small voltage drop is acceptable, although typically the voltage drop across adjacent components is much larger.

As used herein, the term "specific contact resistivity" refers to the slope of the curve of current density (J) vs. voltage (V) at V=0. The units are resistance×area, typically expressed as $\Omega \cdot cm^2$.

As used herein, the term "total contact resistance" refers to the total resistance across a device contact (e.g., the contact to the source or drain of a field effect transistor), normalized to the "width" W of the transistor (typically, the fab node size). The "volume resistivity" $\rho$ (a material property typically reported using the units $\Omega \cdot cm$), is related to the measured "resistance" by $R=\rho t/A$, where t is a thickness and $A=L \times W$ is an area (L is a length, W is a width). The "total contact resistance" is $R_C=\rho t/L$, which has the same units as volume resistivity, namely resistance×length. For convenience in working with total contact resistance for semiconductor devices, the units of total contact resistance are commonly expressed in $\Omega \cdot \mu m$ rather than $\Omega \cdot cm$.

The present invention discloses ultra-low-resistivity contacts for use with FETs and other semiconductor devices and methods of making the same. Examples will generally be provided for n-Si semiconductors, although the methods and devices are not limited to any particular semiconductor.

Figure 2:
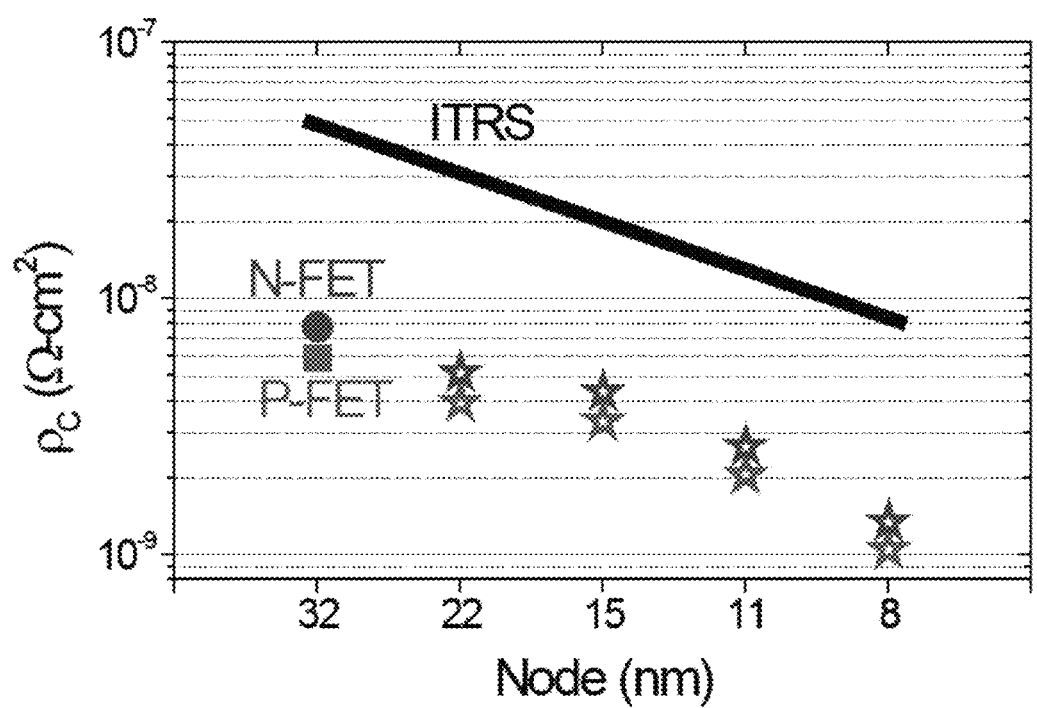
FIG. 2 shows the specific contact resistivity required for different CMOS technology nodes.

The need for lower resistivity contacts is illustrated schematically in FIG. 2. The projections are based on a total contact resistance of 30 $\Omega \cdot \mu m$ which is roughly the performance of production contacts at the 32 nm CMOS node (i.e., for a CMOS fab operating at a minimum feature size of 32 nm). As can be seen in FIG. 2, it is projected that specific contact resistivities approaching $10^{-9}$ $\Omega \cdot cm^2$ will be required by the time the industry gets to sub-10-nm feature sizes.

A common approach now in use for making low resistivity contacts is to deposit a Ni—Pt alloy on n-Si and then anneal to form a NiPt silicide. It is a goal of the present invention to provide contacts having significantly lower specific contact resistivity than can be achieved using Ni—Pt contacts.

Figure 3:
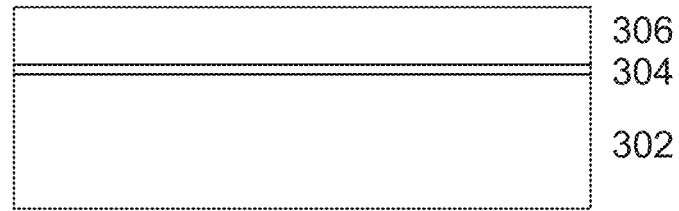
FIG. 3 shows a diagram for an embodiment of the present invention having an ultra-low specific resistivity contact.

In some embodiments, as shown in FIG. 3, the conductor can be a second layer 306 comprising a transition metal (e.g., Ti). A first layer 304 of an interfacial dielectric comprising a sub-stoichiometric oxide of the transition metal (e.g., $TiO_x$; $x<2$) can be added between the second layer 306 and the semiconductor 302 (e.g., n-Si) to build an MIS structure with Fermi level unpinning similar to that described by Agrawal et al. (op cit.; note that Agrawal uses different materials). The combination of a sufficiently thin controlled thickness and a sub-stoichiometric oxide composition can provide specific contact resistivities of about $10^{-9}$ $\Omega \cdot cm^2$ or below (after heating).

In some embodiments, the MIS contact is formed by depositing a first layer of 1-3 nm thickness of one or more metals followed by a second layer of 2-5 nm thickness of one or more metals plus nitrogen and oxygen. The metals typically comprise transition metals, such as Ti or Zn. The particular metals in the first and second layers can be the same or different, and where more than one metal is used, the relative amounts can vary between layers. In some embodiments, the same metal is used in both the first and second layer. The ratio of oxygen atoms to nitrogen atoms in the second layer can be initially (before the heating step) about 1:10. The second layer can comprise a nitride or oxynitride of the metal. The oxygen in the second layer may or may not be covalently bonded to the metal. An oxynitride layer can optionally contain addition oxygen. In some embodiments, the second layer can comprise any combination of metal nitride, metal oxynitride, and oxygen, provided that sufficient oxygen is present to supply oxygen to form the sub-stoichiometric oxide during heating.

In some embodiments, the second layer comprises titanium nitride or zinc nitride containing oxygen. In some embodiments, the second layer comprises a transition metal oxynitride such as titanium oxynitride or zinc oxynitride. The nitride and/or oxynitride need not conform to a particular stoichiometry.

In some embodiments, the first layer 304 (before heating) can be generally between about 1 nm and about 3 nm. In some embodiments, the first layer 304 can be about 2.5 nm thick. In some embodiments, the second layer 306 (before heating) can be between about 2 nm and about 5 nm.

After deposition, the layer stack is annealed (for example, heated to 400-500° C. for 30-60 s). In some embodiments, the annealing is performed in the presence of an inert gas atmosphere. In some embodiments the annealing is performed in an oxygen-free atmosphere. In some embodiments the annealing is performed in an atmosphere comprising nitrogen. The annealing allows oxygen atoms to migrate from the second layer (metal nitride layer) into the first layer (metal layer) to form a sub-stoichiometric metal oxide (e.g., $TiO_x$). Any suitable annealing method can be used including rapid thermal annealing (RTA), laser annealing, etc.

Any suitable semiconductor processing technology can be used to form the first and second layers. An exemplary list of processing technologies includes physical vapor deposition (PVD), chemical vapor deposition (CVD), atomic layer deposition, and plasma-enhanced variations thereof, as well as wet processing methods such as electroplating and electroless deposition.

Embodiments of the present invention also provide High Productivity Combinatorial (HPC) processing techniques for the development of ultra-low-resistivity contacts for semiconductor devices. An optimized contact can provide substantial improvements in device performance.

The performance of semiconductor devices is affected by the structure of the materials selected for use as components of the device, for example, whether the materials have an amorphous or specific crystalline structure. Examples of these semiconductor devices include electronic devices, optoelectronic devices. The materials for these devices include metals, metal alloys, conductive metal nitrides, conductive metal silicides, conductive metal oxides, or conductive metal carbides. The structure of the materials will vary with material composition and with variations in deposition technique and deposition process conditions. The structure of the materials will also vary with lattice constants of material layers with which the materials are in contact, for example, when a second material layer is formed on a first material layer. Therefore, the structure must be measured and evaluated as a function of many variables. Due to wafer-to-wafer variation, it is desirable to evaluate the influence of all of the variables on a single, or small number, of wafers. In some embodiments, methods are provided wherein the deposition technique and deposition process condition variables are varied in a combinatorial manner on a single, or small number, of wafers.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for HPC processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

Figure 4:
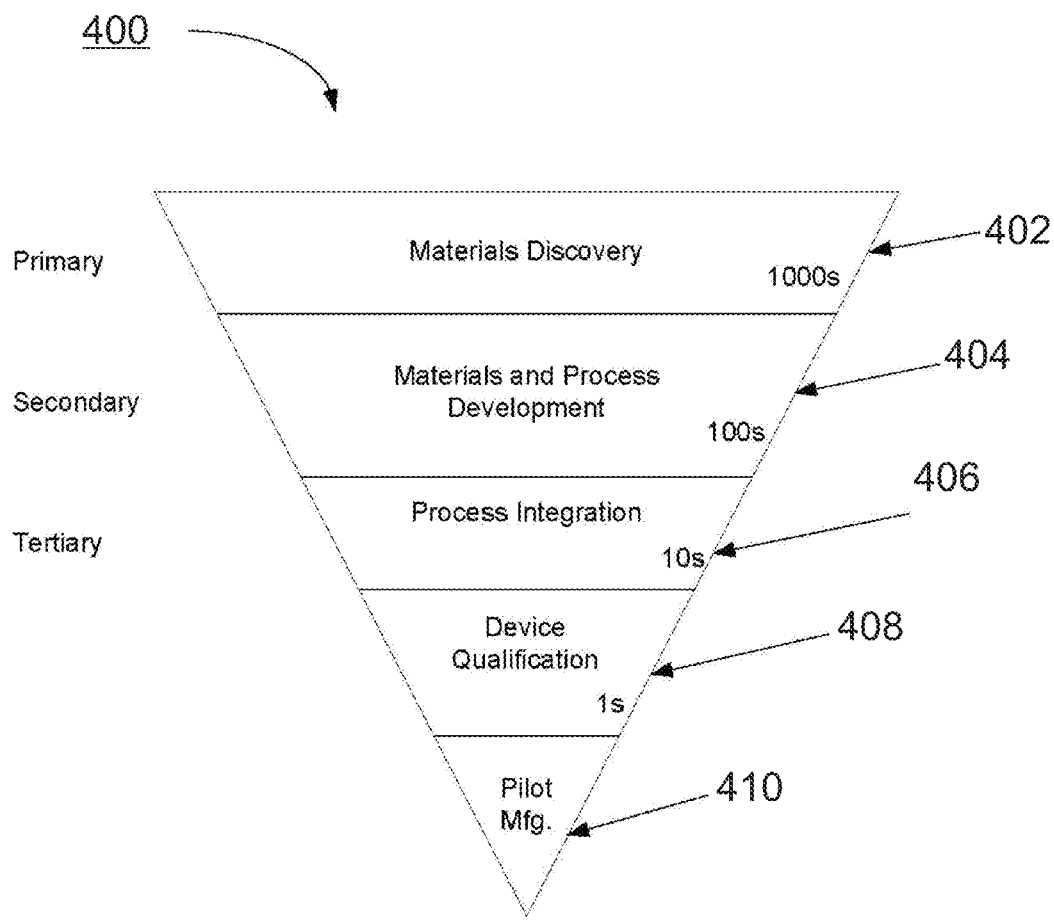
FIG. 4 is a schematic diagram for implementing combinatorial processing and evaluation.

FIG. 4 illustrates a schematic diagram, 400, for implementing combinatorial processing and evaluation using primary, secondary, and tertiary screening. The schematic diagram, 400, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 402. Materials discovery stage, 402, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 404. Evaluation of the materials is performed using metrology tools such as electronic testers and imaging tools (i.e., microscopes).

The materials and process development stage, 404, may evaluate hundreds of materials (i.e., a magnitude smaller than the primary stage) and may focus on the processes used to deposit or develop those materials. Promising materials and processes are again selected, and advanced to the tertiary screen or process integration stage, 406, where tens of materials and/or processes and combinations are evaluated. The tertiary screen or process integration stage, 406, may focus on integrating the selected processes and materials with other processes and materials.

The most promising materials and processes from the tertiary screen are advanced to device qualification, 408. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 410.

The schematic diagram, 400, is an example of various techniques that may be used to evaluate and select materials and processes for the development of new materials and processes. The descriptions of primary, secondary, etc. screening and the various stages 402-410, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The '137 application is generally directed to the fabrication of thin-film photovoltaic (TFPV) devices, but the skilled artisan will recognize that the same HPC methods can be applied to the instant methods for forming transistors and other semiconductor devices. The embodiments described herein enable the application of combinatorial techniques to process sequence integration in order to arrive at a globally optimal sequence of device manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the device. For example, such structures may include, but would not be limited to, contact layers, buffer layers, semiconductor layers, or any other series of layers or unit processes that create an intermediate structure found on devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 5:
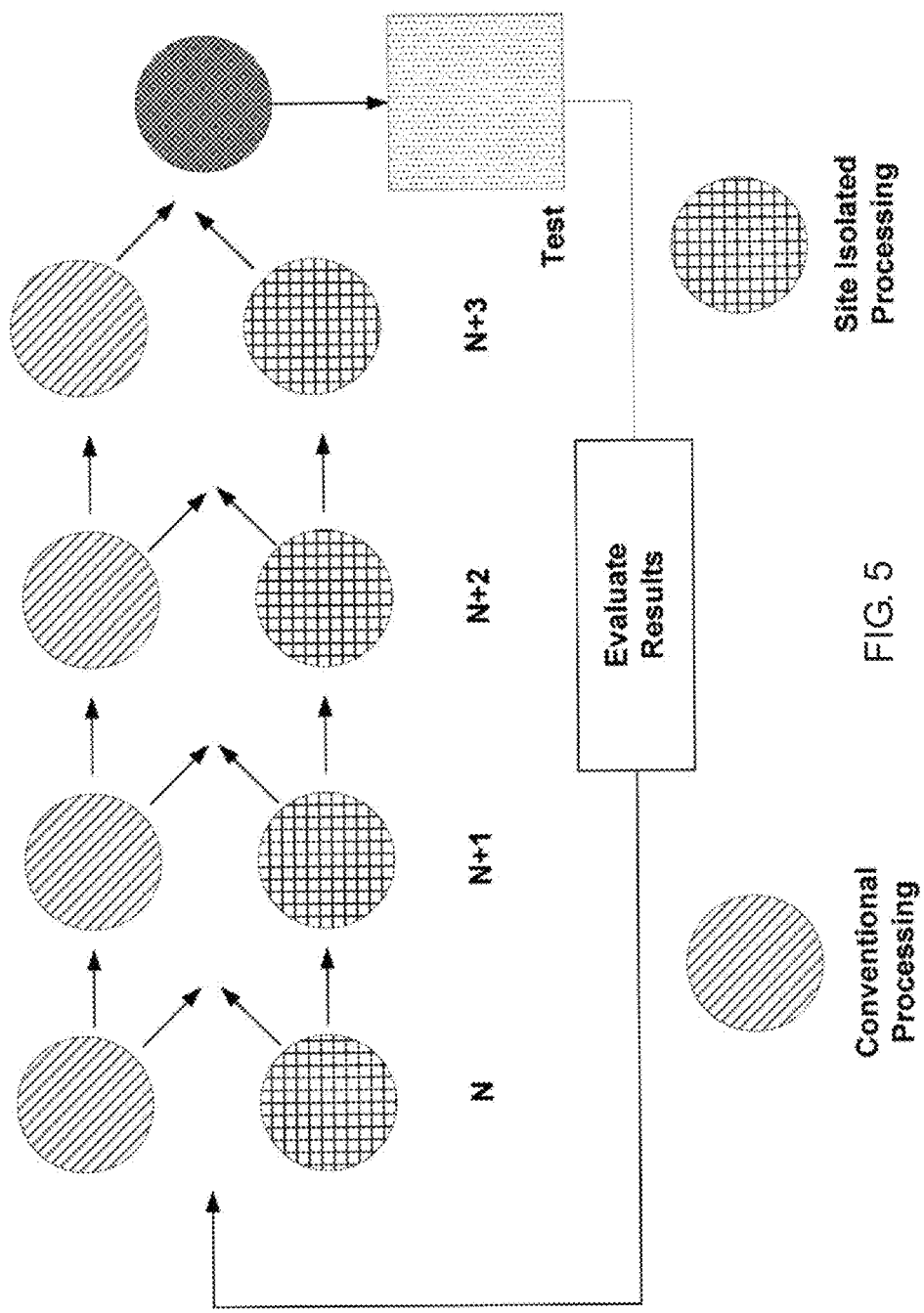
FIG. 5 is a schematic diagram for illustrating various process sequences using combinatorial processing and evaluation.

FIG. 5 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 5. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in device manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

In general, the method for deposition of each feature can be varied in a combinatorial manner by varying process conditions among site isolated regions on a substrate. Such variations can include PVD, ALD, CVD, and plasma enhanced variations thereof, etc. process conditions for the formation of the first and second layers and semiconductor features, e.g., gate oxide and the semiconductor channel. Sizes and shapes can be varied, for example, the channel length and width and thickness for a given fab feature size. Gate metals can be deposited using any convenient deposition method. For example, gate metals can be deposited using physical vapor deposition (PVD), and the PVD process conditions can be varied combinatorially. PVD process parameters that can be varied to include, but are not limited to, process material amounts, reactant species, processing temperatures, processing times, processing pressures, substrate bias, substrate temperature, magnetron power, atmospheres in which the processes are conducted, order in which materials are deposited, etc. In particular, PVD process parameters can be varied to test which process parameters provide desired template layer composition, layer thickness, layer uniformity, crystallinity, crystal orientation, grain size, electrical properties (such as resistivity and dielectric constant), reproducibility, variability with respect to SIR location within a wafer, etc.

In some embodiments, the optimum process parameters, layer compositions, and layer thicknesses can be determined by HPC development methods. For example, in an ALD process, the second layer can be deposited using a Ti precursor such as Tetrakis(dimethylamido) titanium(IV) as an exemplary source of Ti atoms, $NH_3$ as a source of N atoms, and $H_2O$ as a source of O atoms, in addition to other precursors known in the art. Process parameters such as precursor gas flow rates, substrate temperature, chamber pressure, processing time per cycle, number of deposition cycles, precursor gas selection, and so on can be varied in a combinatorial manner. Similarly, the process parameters for annealing (temperature, temperature profile, annealing time, power, etc.) can be varied combinatorially. The amount of oxygen in the second layer can be varied combinatorially. The selection of material deposition and annealing technology can also be varied combinatorially. The resulting contacts can be characterized by standard testing methods to determine which contacts are most suitable for a given end-use application. In addition to specific contact resistivity, other important contact characteristics may include processing time, processing cost, stability of resistivity over time and under conditions of electrical stress, and so on.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of fabricating a semiconductor device, the method comprising
   forming a first layer on a semiconductor, wherein the semiconductor comprises a III-V semiconductor, the first layer comprising one or more metals;
   forming a second layer on the first layer, the second layer comprising the one or more metals, nitrogen and oxygen; and
   heating the first and second layer, such that the first layer comprises a sub-stoichiometric metal oxide.

2. The method of claim 1, wherein the one or more metals comprise titanium or zinc.

3. The method of claim 1, wherein the heating is performed in an oxygen-free atmosphere.

4. The method of claim 1, wherein the ratio of oxygen atoms to nitrogen atoms in the second layer is about 1:10 prior to the heating step.

5. The method of claim 1, wherein the thickness of the first layer prior to the heating step is between about 1 nm and about 3 nm.

6. The method of claim 1, wherein the thickness of the first layer prior to the heating step is about 2.5 nm.

7. The method of claim 1, wherein the thickness of the second layer prior to the heating step is between about 2 nm and about 5 nm.

8. The method of claim 1, wherein the first and second layers are formed by physical vapor deposition, atomic layer deposition, chemical vapor deposition, or plasma enhanced variations thereof.

* * * * *